United States Patent [19]

Hasegawa et al.

[11] Patent Number: 5,038,191
[45] Date of Patent: Aug. 6, 1991

[54] SEMICONDUCTOR MEMORY DEVICE

[75] Inventors: Takehiro Hasegawa, Tama; Koji Sakui, Tokyo; Shigeyoshi Watanabe; Fujio Masuoka, both of Yokohama, all of Japan

[73] Assignee: Kabushiki Kaisha Toshiba, Kawasaki, Japan

[21] Appl. No.: 486,842

[22] Filed: Mar. 1, 1990

[30] Foreign Application Priority Data

Mar. 1, 1989 [JP] Japan .................................. 1-49403

[51] Int. Cl.⁵ ...................... H01L 29/72; G11C 11/34
[52] U.S. Cl. ..................................... 357/34; 365/177; 365/159; 307/446
[58] Field of Search ............... 357/34; 365/225.6, 177, 365/159; 307/446, 254, 253

[56] References Cited

U.S. PATENT DOCUMENTS

| | | | |
|---|---|---|---|
| 3,753,248 | 8/1973 | Lynes et al. | 365/177 |
| 4,326,270 | 4/1982 | Owens et al. | 365/225.6 |
| 4,488,262 | 12/1984 | Basine et al. | 365/100 |
| 4,597,063 | 6/1986 | Takemae | 365/189.01 |
| 4,677,589 | 6/1987 | Haskell et al. | 365/177 |
| 4,760,293 | 7/1988 | Hebenstreit | 307/446 |
| 4,788,662 | 11/1988 | Mori | 365/159 |
| 4,794,274 | 12/1988 | Löhn | 307/253 |
| 4,849,934 | 7/1989 | Yokoyama et al. | 365/177 |
| 4,882,534 | 11/1989 | Koshizuka | 307/446 |

Primary Examiner—Rolf Hille
Assistant Examiner—Tan Ho
Attorney, Agent, or Firm—Oblon, Spivak, McClelland, Maier & Neustadt

[57] ABSTRACT

A semiconductor memory device comprises a memory array including a plurality of memory cells arranged in a matrix form, a plurality of word lines arranged in column and a plurality of bit lines arranged in row. Each memory cell includes a bipolar transistor in which a collector-emitter voltage is controlled so that the polarity of a base current changes is changed in accordance with an increase in a base-emitter voltage, and a switching element, provided between the base of the bipolar transistor and an associated bit line and controllable by an associated word line. A switch circuit is provided for applying a collector voltage to the collector of the bipolar transistor smaller in a second state where an associated one of the memory cells is holding data than in a second state where the associated memory cell is accessible for data reading and data writing.

20 Claims, 18 Drawing Sheets

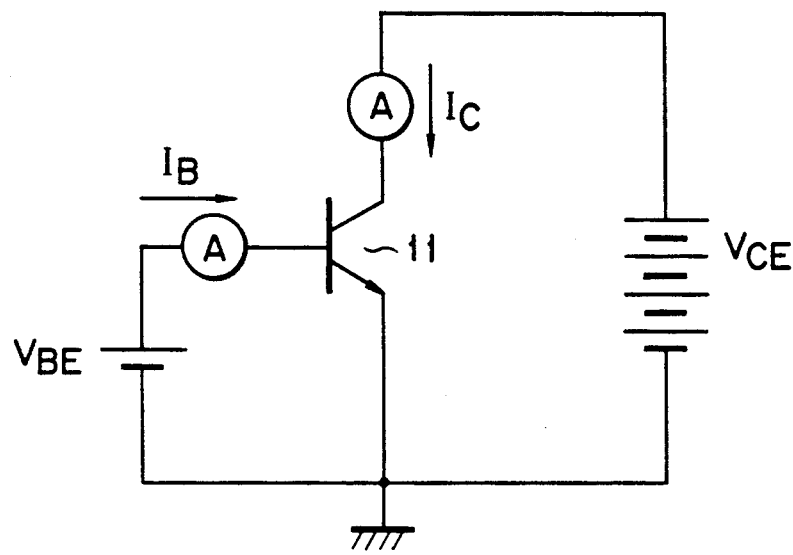
F I G. 1
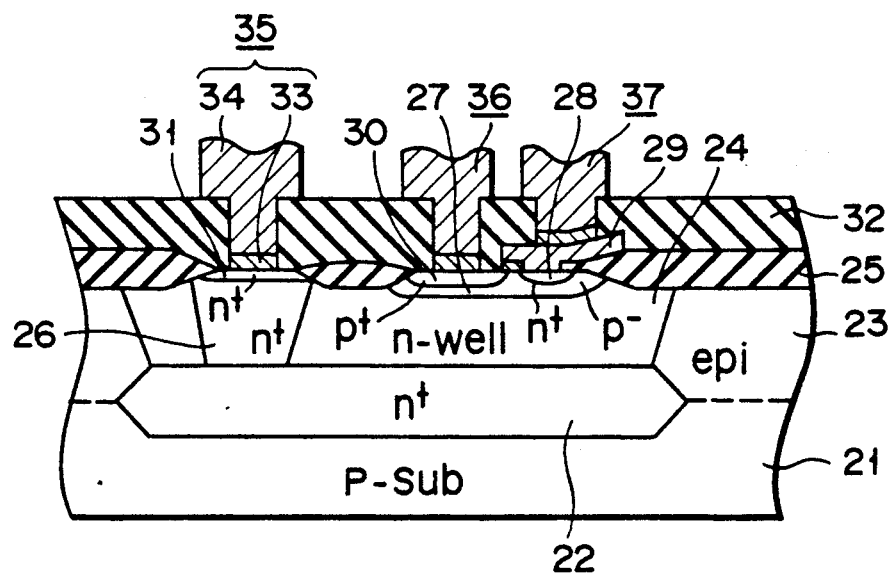
F I G. 2

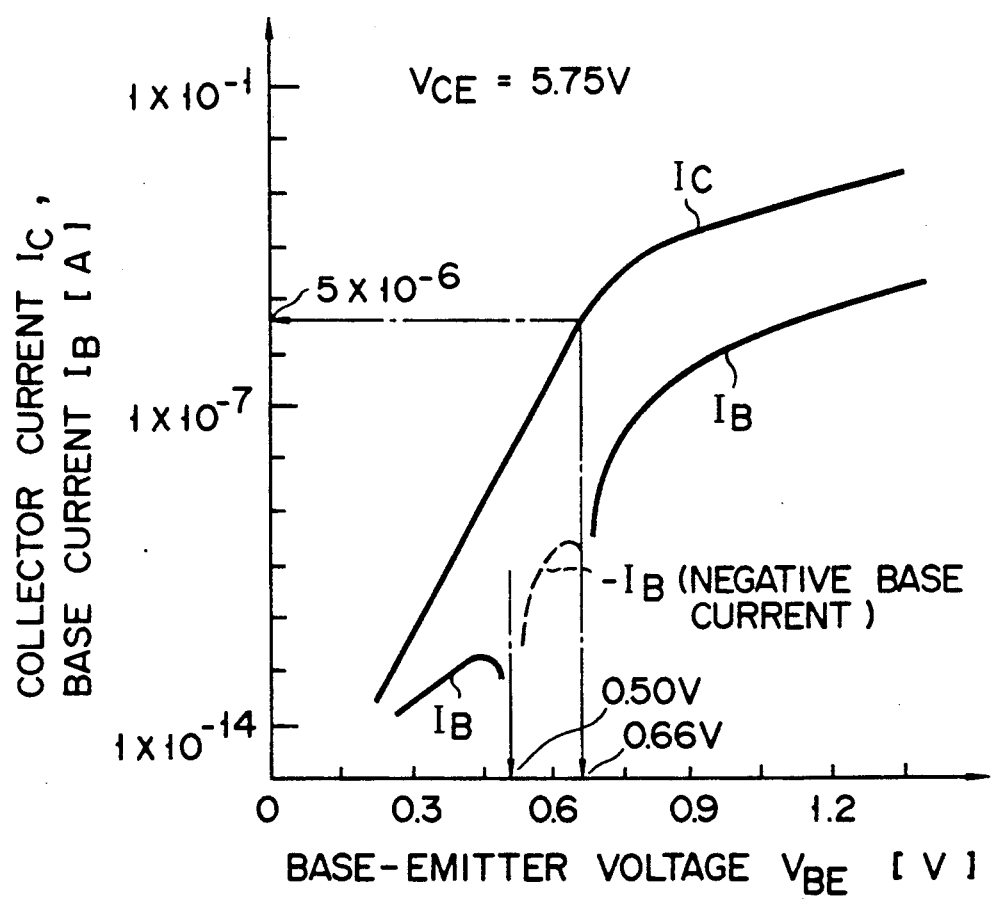
F I G. 5

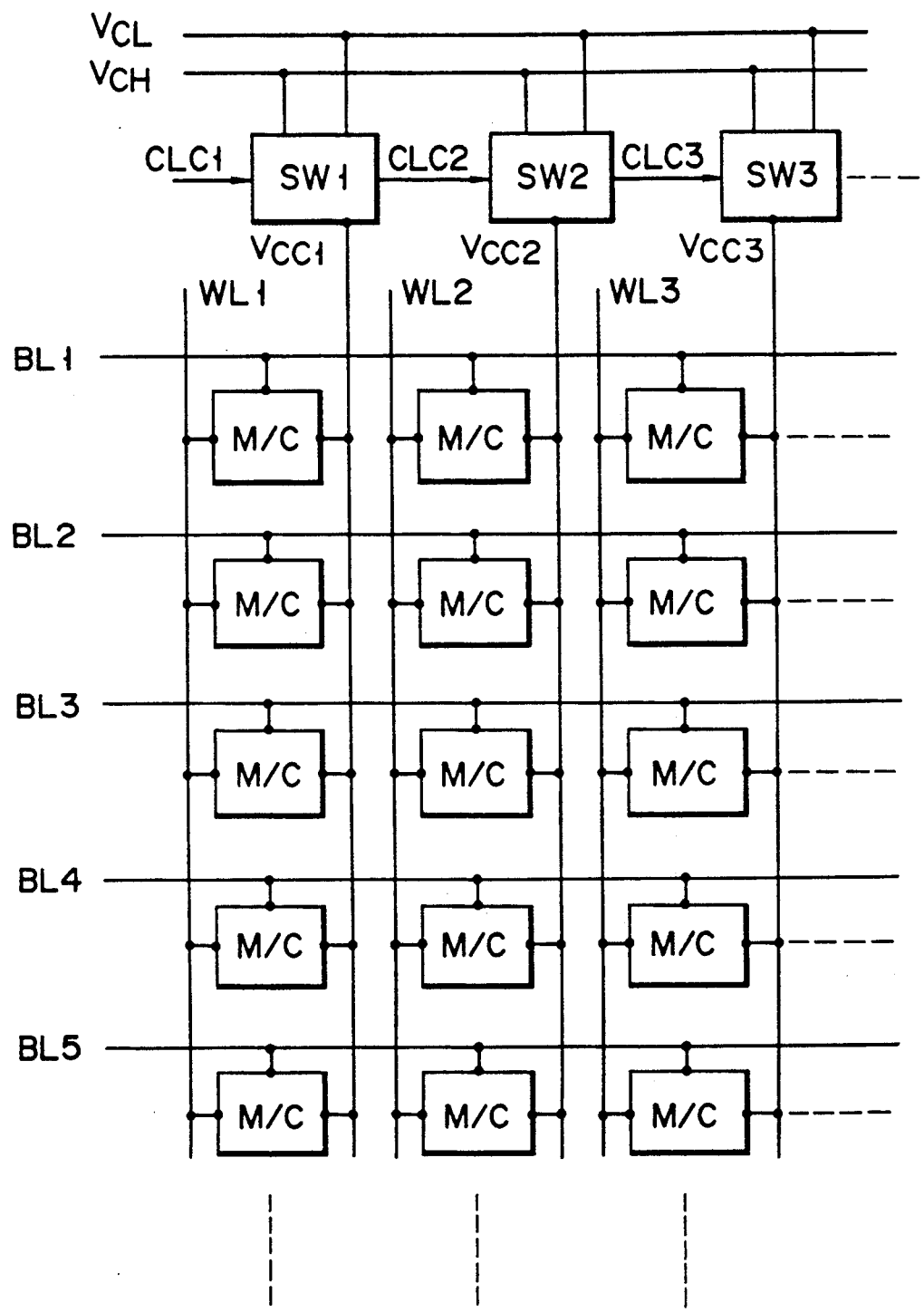
F I G. 11

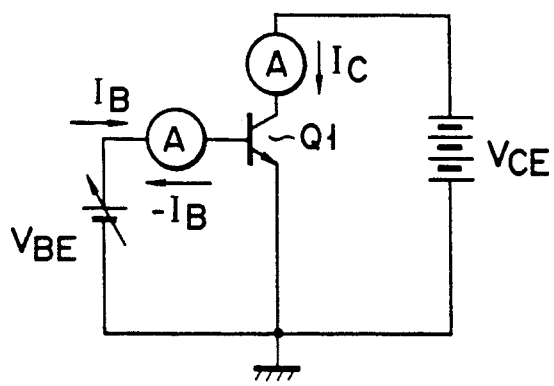
F I G. 14
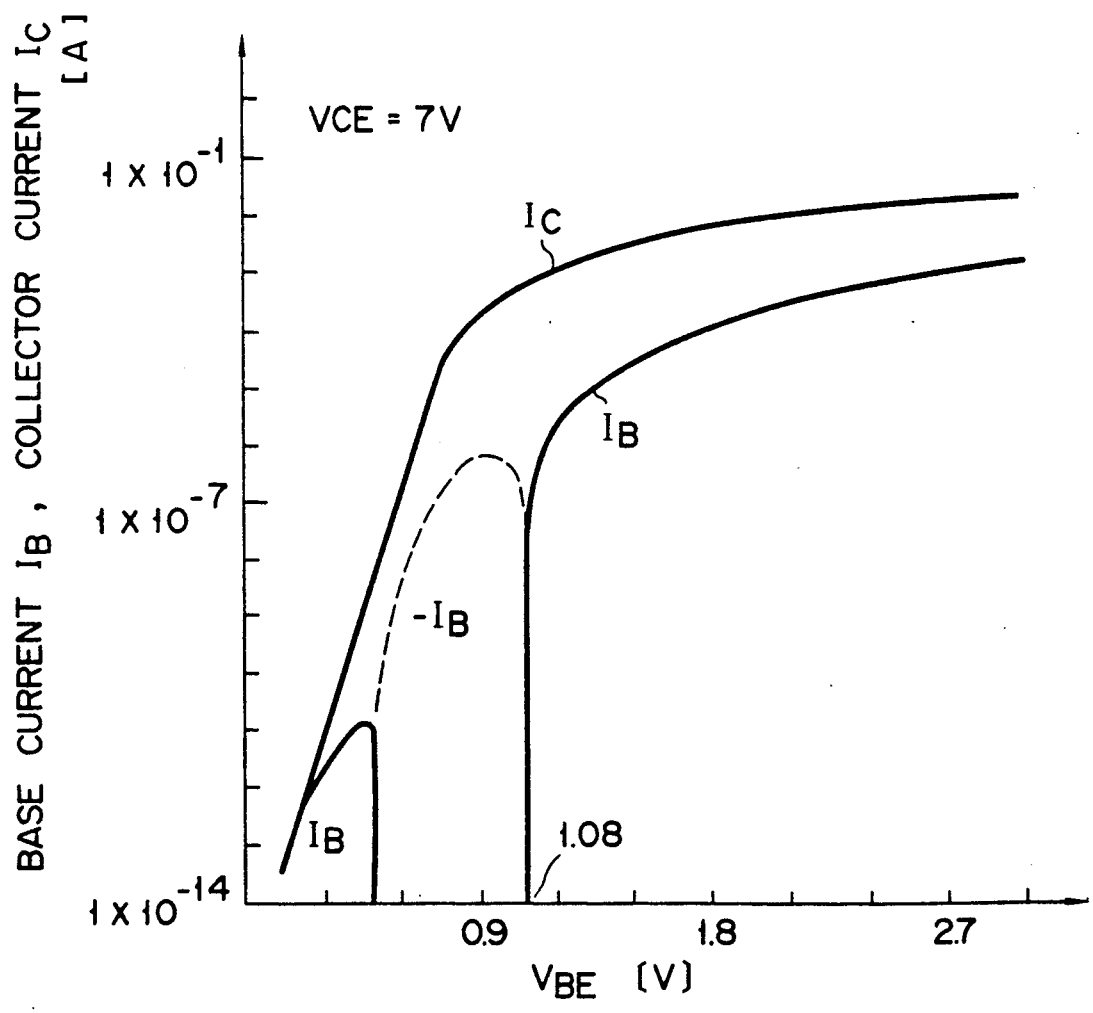
F I G. 15

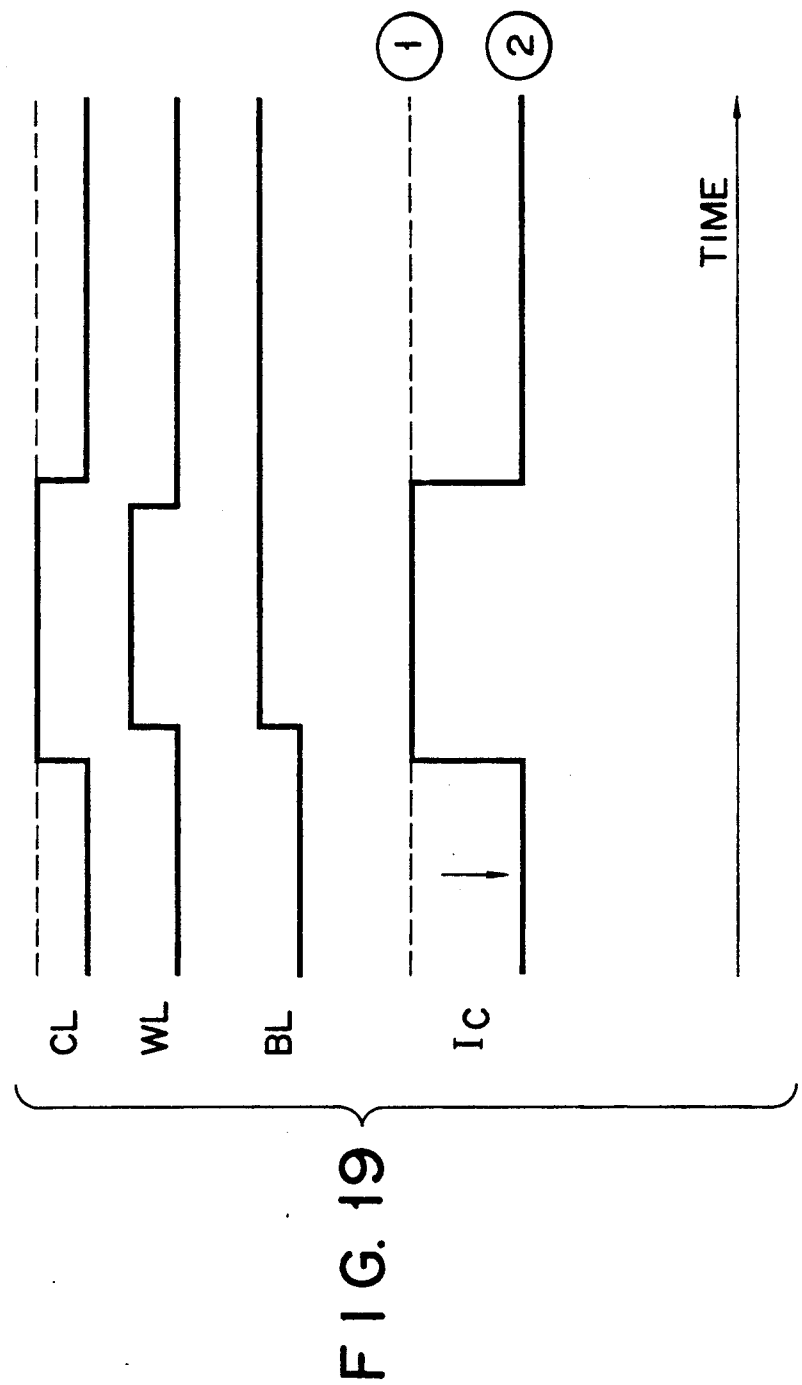
F I G. 19

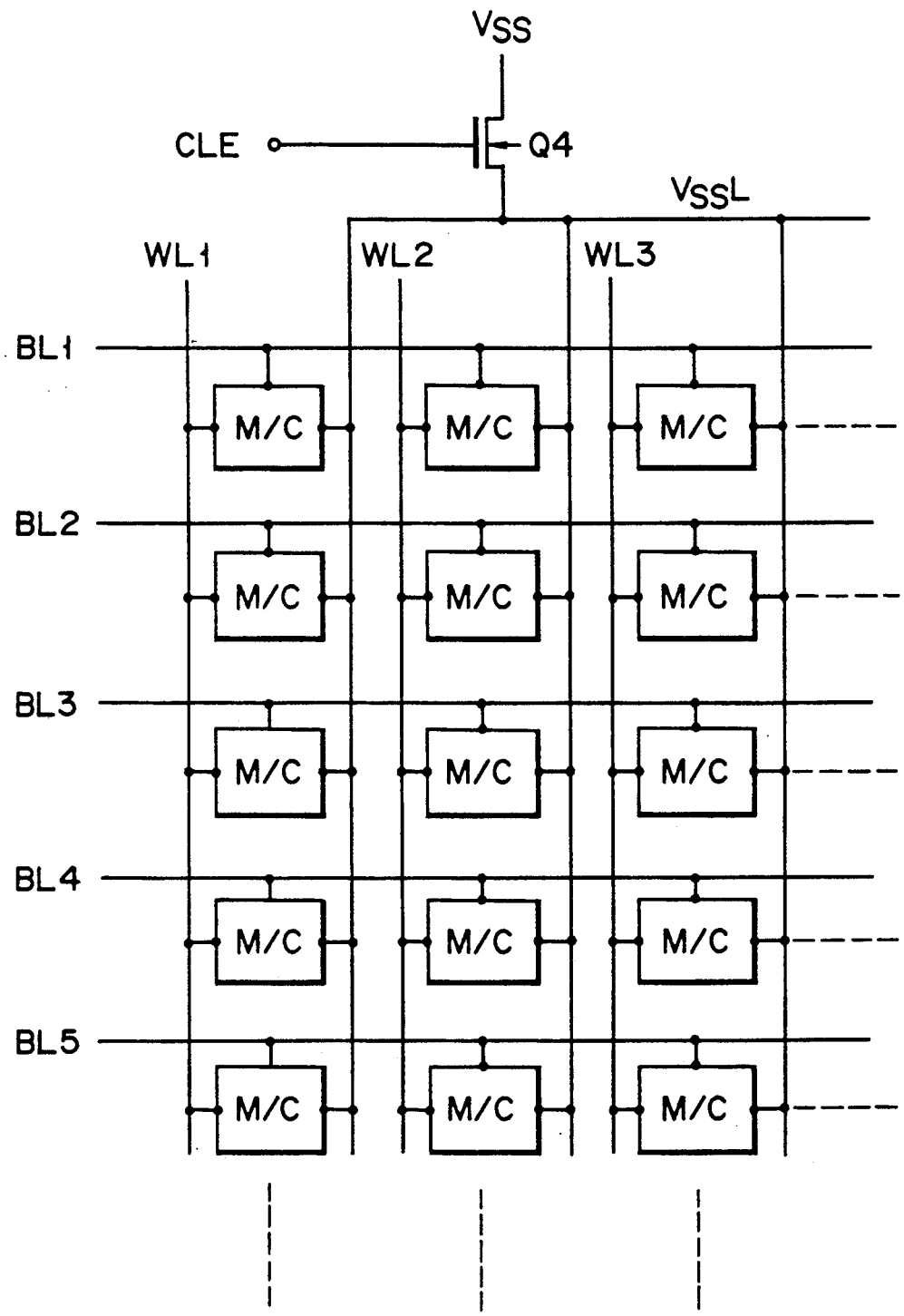
F I G. 20

SEMICONDUCTOR MEMORY DEVICE

BACKGROUND OF THE INVENTION

1. Field of the Invention

The present invention relates to a semiconductor memory device employing bipolar transistors.

2. Description of the Related Art

Bipolar transistors have been used as a current amplifier which receives a base current and outputs a collector current. For instance, when an NPN bipolar transistor is supplied with a positive collector-emitter voltage $V_{CE}$ and a positive base-emitter voltage $V_{BE}$ ($V_{CE} > V_{BE}$), the collector current $I_C$ takes an amplified positive value for various values of the base-emitter voltage $V_{BE}$, and the base current also takes a positive value. As conventional bipolar transistors function alike, they have limited fields of application.

The present inventor has proposed a semiconductor device employing novel bipolar transistors which can permit a positive base current and a negative base current in accordance with the base potential, as disclosed in U.S. Pat. Application Ser. No. 293,807 (filed Jan. 5, 1989). In this semiconductor device, given that the forward base current between the base and emitter is $I_{BE}$ and the reverse base current between the collector and base is $I_{CE}$, the collector-emitter voltage $V_{CE}$ is set as to satisfy $I_{BE} < I_{CB}$ according to the base potential. In this case, the collector voltage is always kept constant.

According to the mentioned prior art semiconductor device, in a memory cell constituted by a bipolar transistor, it is necessary to set the collector potential high and thus enhance the current drivability of the base in order to charge a capacitor on a bit line at the time of reading data of a high-potential level and prevent data from being influenced by noise generated at the rising or falling of a word line. Since the collector potential is high even while the memory cell is holding data, however, a through current flows to the emitter from the collector, thus increasing current consumption.

SUMMARY OF THE INVENTION

Accordingly, it is an object of this invention to provide a semiconductor memory device which comprises bipolar transistors capable of permitting positive and negative base currents to flow therethrough, and can reduce current dissipation.

According to this invention, there is provided a semiconductor memory device comprising an array of memory cells each including a bipolar transistor in which a collector-emitter voltage is controlled so that the polarity of a base current is changed in accordance with an increase in a base-emitter voltage, and a switching element, provided between a base of the bipolar transistor and a bit line and controllable through a word line; and means for setting a current flowing through the collector of the bipolar transistor lower in a first state where an associated memory cell is holding data than in a second state where the associated memory cell is accessible for data reading and data writing.

According to the semiconductor memory device with the above structure, the collector current of the bipolar transistor is set smaller at the time of holding data than at the time of data reading or writing, thus reducing the through current flowing to the emitter from the collector and reducing the power dissipation as a consequence. In addition, the current flowing through the collector at the time of data writing and data reading is increased to improve the performance of charging and discharging the capacitor on a bit line generated by an increase in cell reading and writing currents at such times. This can prevent data from being damaged by noise caused by the rising or falling of a word line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a semiconductor device which is for use in a semiconductor memory device according to one embodiment of the present invention and employs bipolar transistors;

FIG. 2 is a cross section of a bipolar transistor;

FIG. 5 illustrates the relation between a base-emitter voltage, a collector current and a base current when $V_{CE} = 5.75$ V;

FIG. 11 is a circuit diagram of a semiconductor memory device according to another embodiment of this invention;

FIG. 14 is a circuit diagram of a circuit for measuring the characteristic of a bipolar transistor;

FIG. 15 is a diagram showing the characteristic provided by the circuit in FIG. 14;

FIG. 19 is a timing chart for explaining the operation of the memory cell shown in FIG. 18;

FIG. 20 is a circuit diagram of a semiconductor memory device according to a still another embodiment of this invention;

DETAILED DESCRIPTION OF THE PREFERRED EMBODIMENTS

Figure 3:
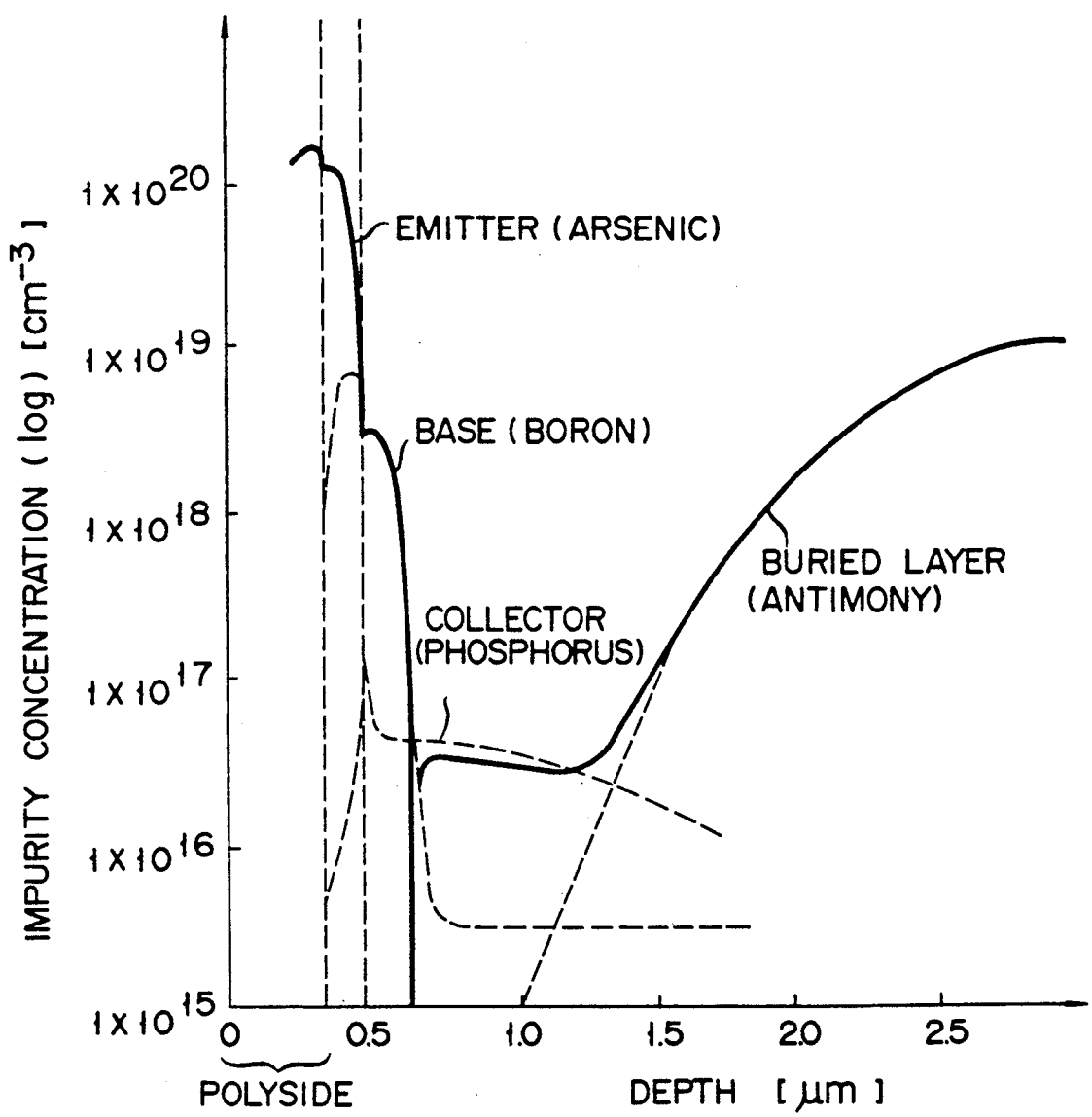
FIG. 3 is a diagram illustrating an impurity profile of the bipolar transistor shown in FIG. 2.

FIG. 2 illustrates the structure of a bipolar transistor used in this invention which has a N+ buried layer 22 formed on the surface of a P− type silicon substrate 21 to decrease a collector resistance. Also formed on this substrate 21 is a P− type epitaxial silicon layer 23 in which phosphorus is doped to form an N type well 24. A field oxide layer 25 is formed on both the silicon layer 23 and N type well layer 24, with a collector lead layer 26 formed to reach the N+ buried layer via one opening of this layer 25. A P− type base region 27 is formed via another opening of the field oxide layer 25 in the N type well layer 24. An N+ type emitter region 28 of 2 μm×5 μm is formed in part of the P− type base region 27, and an emitter polycide 29 is formed on the emitter region 28. A P− type layer 30 is formed in the P− base region 27 by self-alignment with the emitter polycide 29, and an N+ layer 31 is formed on the collector lead layer 26.

Thus constituted semiconductor structure is covered with a silicon oxide film 32, and collector, base and emitter electrodes 35, 36 and 37 made of Al-Si layer 34 are formed through a Ti/TiN film in contact holes formed in this film 32.

In the fabrication of the above semiconductor device, Sb is thermally diffused in the P−0 type silicon substrate 21 under the atmosphere of $Sb_2O_3$ at 1250° C. for 25 minutes to form the N+ type buried layer 22. Then, the P− epitaxial silicon layer 23 is grown under the atmosphere of $SiH_2Cl_2+B_2H_6$ at 1150° C. for 10 minutes. Thereafter, phosphorus is ion-implanted in the silicon layer 23 with an acceleration voltage of 160 KeV and a dose of $5\times10^{12}$ cm$^{-2}$, and the resultant structure is annealed at 1100° C. for 290 minutes. As a result, phosphorus is diffused in the silicon layer 23 to thereby form the N type well 24.

Then, the filed oxide layer 25 is formed on the surface of the semiconductor structure and phosphorus (P+ is ion-implanted in the N type well layer 24 to thereby form the N+ type collector lead layer 26. Boron (B+) is then ion-implanted in the N type well layer 24 with an acceleration voltage of 30 KeV and a dose of $5\times10^{13}$ cm$^{-2}$ to form the P− base region 27. Thereafter, a thin silicon oxide film is formed on the surface of the semiconductor structure, with an opening being formed in this silicon oxide film; polysilicon of 500 Å is adhered through this opening to the base region 27. Arsenic (As+) is ion-implanted in this polysilicon with an acceleration voltage of 60 KeV and a dose of $5\times10^{15}$ cm$^{-2}$. MoSi is then adhered on the polysilicon and the resultant structure is subjected to patterning, thereby forming the emitter polycide 29.

Boron (B+) is ion-implanted in the base region 27 to form the P+ type layer 30. Arsenic (As+) is ion-implanted in the collector lead layer 26 to form the N+ type layer 31. Then, the silicon oxide film 32 is deposited on the surface of the semiconductor structure formed by the above steps, and contact holes are formed in this film 32, with the Ti/TiN film 33 being adhered to the bottom portions of the contact holes. The Al-Si layer 34 is then deposited on thus formed semiconductor structure, and the resultant structure is subjected to patterning to form the collector, base and emitter electrodes 35, 36 and 37.

FIG. 3 illustrates the impurity distribution of the NPN bipolar transistor of the semiconductor device fabricated in the above manner.

The emitter has an impurity density of $1.5\times10^{20}$ cm$^{-3}$ at a depth of 0.15 μm from the P− type epitaxial silicon layer 23, the base has an impurity density of $3\times10^{18}$ cm$^{-3}$ at a depth of 0.3 μm, and the collector has an impurity density of $4\times10^{16}$ cm$^{-3}$ in the well region.

The semiconductor device fabricated under the above conditions forms the NPN bipolar transistor circuit as shown in FIG. 1. In this circuit, with the base-emitter voltage being $V_{BE}$ and the collector-emitter voltage $V_{CE}$, the collector current $I_C$ and base current $I_B$ vary with the base-emitter voltage $V_{BE}$ as shown in FIG. 4.

Figure 4:
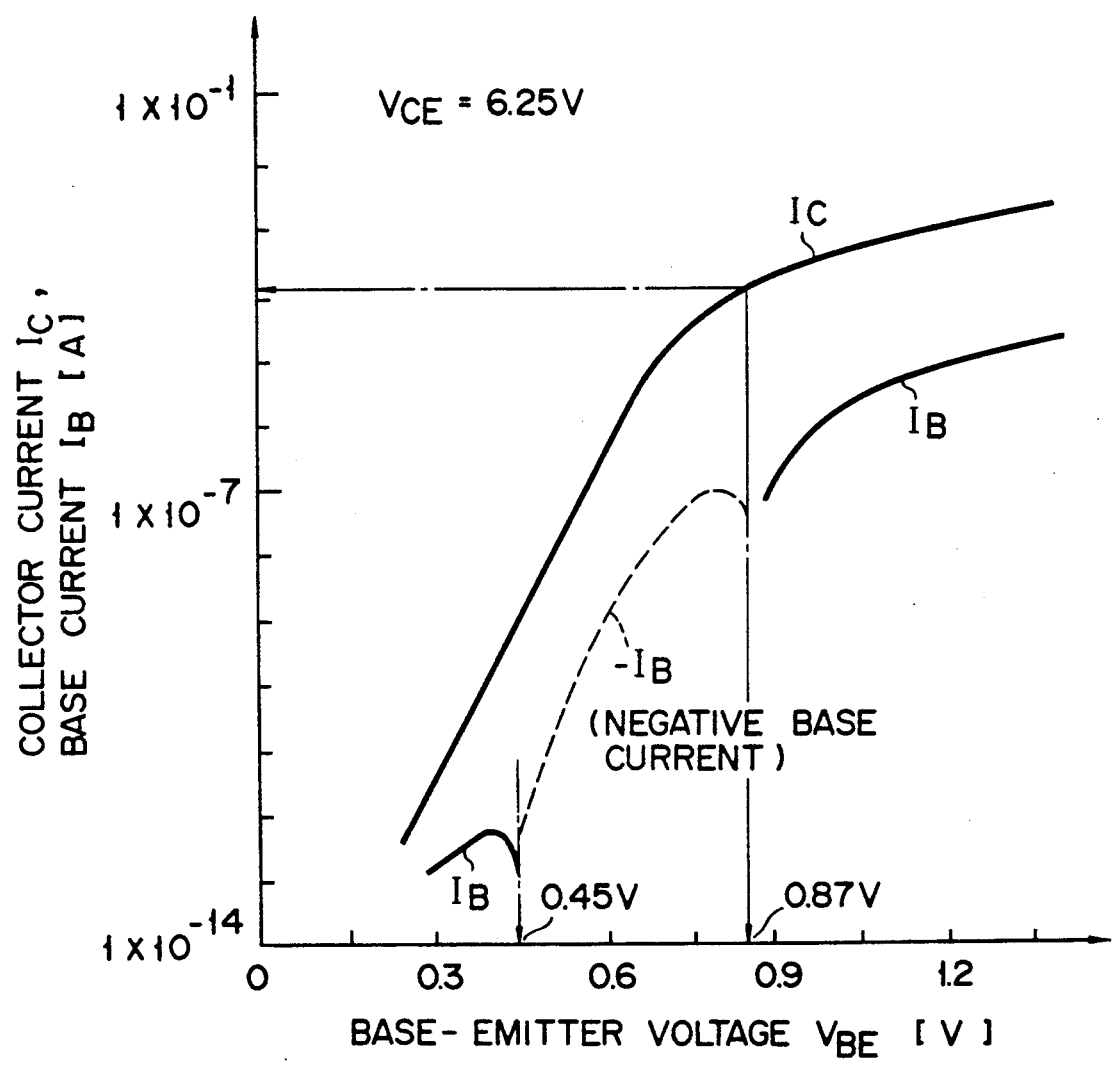
FIG. 4 illustrates the relation between a base-emitter voltage, a collector current and a base current when $V_{CE} = 6.25$ V.

FIG. 4 illustrates the current characteristic for the collector-emitter voltage $V_{CE}$ being set at 6.25 V. For 0 V$<V_{BE}<$0.45 V, the positive base current $I_B$ flowing to the base from the positive terminal of a power source of the base-emitter voltage $V_{BE}$ has the characteristic indicated by the solid line, for 0.45 V$<V_{BE}<$0.87 V, the negative base current $-I_B$ flowing to the positive terminal of the power source from the base has the characteristic indicated by the broken line, and for 0.87 V$<V_{BE}$, the positive base current $I_B$ flowing again from the positive terminal of the power source of the base-emitter voltage $V_{BE}$ has the characteristic indicated by the solid line.

FIG. 5 illustrates the collector current and base current characteristics for the collector-emitter voltage $V_{CE}$ being set at 5.75 V. As should be obvious from this diagram, the range for the base-emitter voltage for causing the base current $I_B$ negative is 0.50V$<V_{Be}<$0.66 V.

Figure 6:
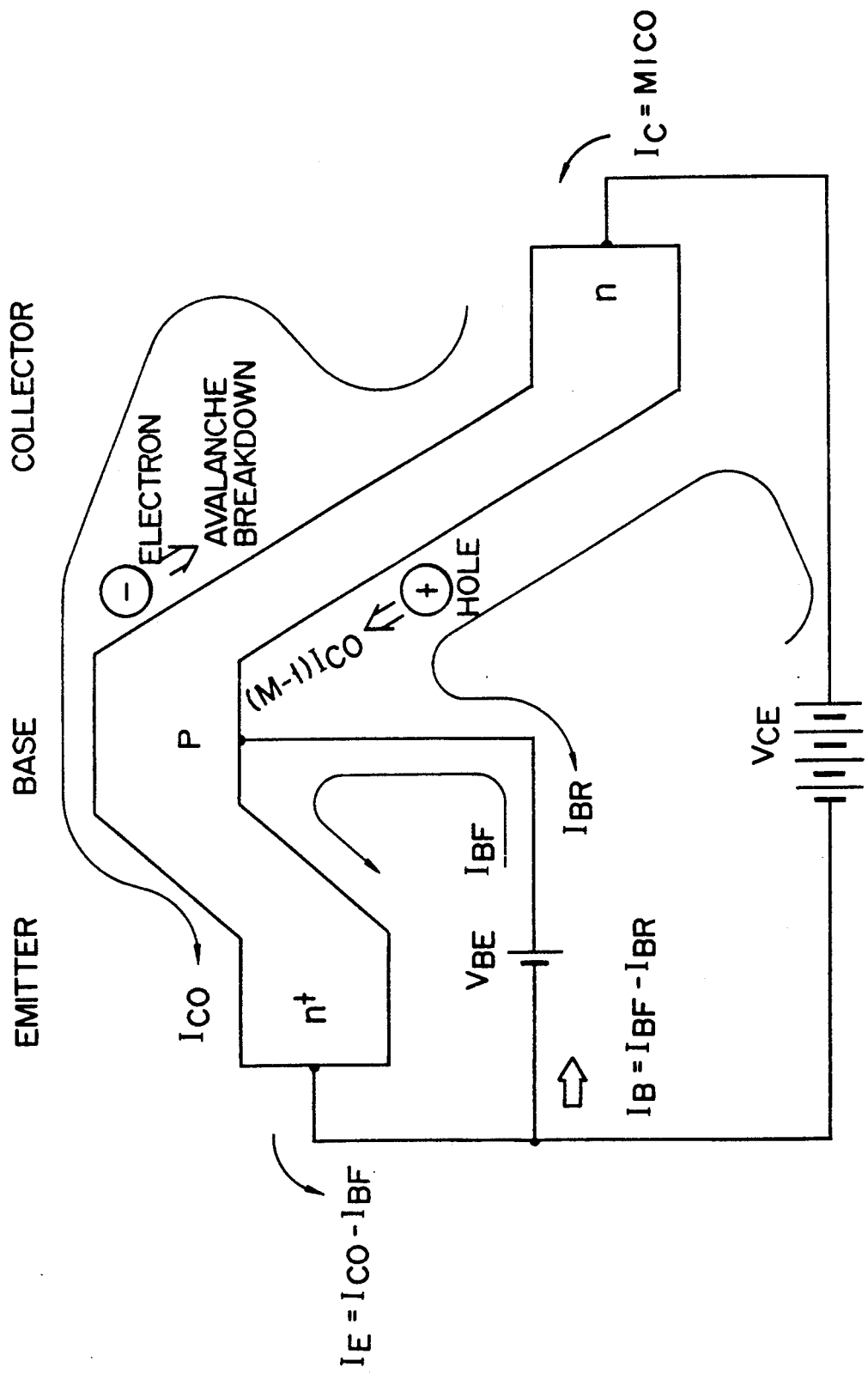
FIG. 6 is a diagram for explaining the operational principle of the semiconductor device shown in FIG. 1.

The following will describe how the negative base current flows referring to FIG. 6.

The negative current is generated by the level relation between the forward base current $I_{BE}$ (denoted by $I_{BF}$ in the diagram as it flows in the forward direction) flowing to the emitter from the base and the reverse base current $I_{CB}$ (denoted by $I_{BR}$ as it flows in the reverse direction) in the collector-base passage formed by carriers generated by impact ionization at the PN junction of the base and collector.

When $|I_{BE}|>|I_{CB}|$, the base current becomes positive ($I_B$) as can be observed in the ranges of 0 V$<V_{BE}<$0.45 V and 0.87 V$<V_{BE}$ in FIG. 4, and when $|I_{BE}|<|I_{CB}|$, it becomes the negative base current $-I_B$ as observed in the range of 0.45 V$<V_{BE}<$0.87 V.

When electrons implanted from the emitter enter a depletion layer of the base-collector junction, these electrons form electron-hole pairs by impact ionization as the collector voltage is high in the direction of avalanche breakdown. The generated electrons and holes are drifted respectively to the collector and base by an electric field between the base and collector. The holes drifted to the base form the negative base current $I_{BR}$. The positive base current $I_{BF}$ flowing to the emitter from the base is restricted to the fixed base-emitter voltage $V_{BE}$. As a result, when $I_{BR}$ is greater than $I_{BF}$, the reverse base current can be observed. In a case when the reverse base current appears, as the current of the generated electrons is smaller than the current of the electrons implanted from the emitter, it slightly increases the magnitude of the collector current. This state will be described below using some equations. In the Ebers-Moll model, the collector current $I_{CO}$ and base current $I_{BF}$ for an ordinary transistor are expressed by equations (1) and (2) presented below.

$$I_{CO} = \alpha F I_{ES}\left(\exp\left(\frac{qV_{BE}}{kT}\right) - 1\right) - I_{CS}\left(\exp\left(\frac{qV_{BE}}{kT}\right) - 1\right) \quad (1)$$

$$I_{BF} = (1 - \alpha F) I_{ES}\left(\exp\left(\frac{qV_{BE}}{kT}\right) - 1\right) - \\ (1 - \alpha F) I_{CS}\left(\exp\left(\frac{qV_{BE}}{kT}\right) - 1\right) \quad (2)$$

where IES is a reverse saturation current of the emitter-base junction, $I_{CS}$ is a reverse saturation current of the collector-base junction, $\alpha$ F is the ratio of that of the current flowing across the emitter-base base junction which has reached the collector to this current, $\alpha$ R is the ratio of that of the current flowing across the collector-base junction which has reached the emitter to this current, k is the Boltzmann constant, T is the absolute temperature, and q is the amount of charges. In a case where the collector-emitter voltage $V_{CE}$ is high and impact ionization at the base-collector PN junction is not negligible, the collector current $I_C$ is expressed by:

$$I_C = MI_{CO} \quad (3)$$

$$M = \frac{1}{1 - (V_{CB}/BV_{CBO})n} \quad (4)$$

where $I_{CO}$ is the collector current when impact ionization is neglected, n is a coefficient and $BV_{CBO}$ is the breakdown voltage between the base and collector with the emitter being open.

Figures 7, 9:
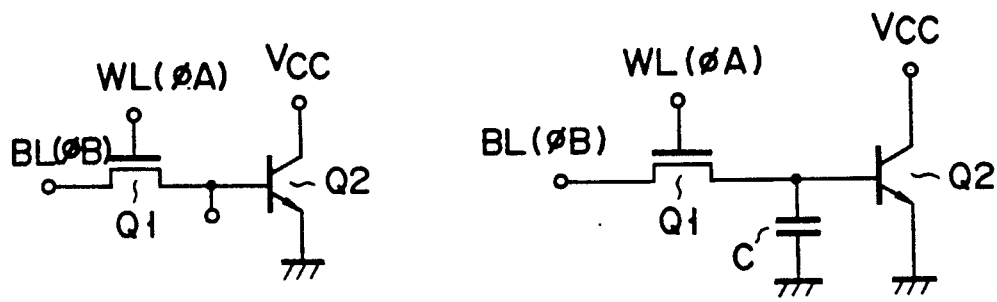
FIG. 7 is a circuit diagram of a memory cell.
FIG. 9 is a circuit diagram of another memory cell.

As shown in FIG. 7, holes generated by impact ionization flow through the base by an electric field to be the reverse base current $I_{BR}$.

Thus, $I_{BR}$ is attained by the following equation.

$$I_{BR} = (M-1)I_{CO} \quad (5)$$

That is, the base current $I_B$ can be expressed at the difference between the forward base current $I_{BF}$ and the reverse base current $I_{BR}$ as follows.

$$I_B = I_{BF} - I_{BR} = I_{BF} - (M-1) \\ I_{CO}\{1 - (M-1)h_{FE}\{I_{BF}\dots$$

where $h_{FE}$ is a current gain ($h_{FE} = I_{CO}/I_{BF}$).
The emitter current $I_E$ is expressed by $$I_E = I_{CO} + I_{BE}.$$

The description of the operation for an NPN bipolar transistor can also apply to a PNP bipolar transistor.

With regard to the operation of the bipolar transistor circuit shown in FIG. 1, assuming that a capacitive load exists between the base and emitter as mentioned in the foregoing description given with reference to FIGS. 4 and 5, when the base voltage $V_{BE}$ is $0 V < V_{BE} < 0.45 V$, charges accumulated in the load flow out to the emitter from the base, so that the voltage $V_{BE}$ across the load drops and approaches to 0 V. When $0.45 V < V_{BE} < 0.87$ V, the reverse base current accumulates charges in the load, and the voltage $V_{BE}$ across the load rises to approach 0.87 V. When $V_{BE} > 0.87$ V, the positive base current flows to the emitter from the base, thus causing the voltage $V_{BE}$ across the load to drop and likewise approach 0.87 V. It should be noted that since $V_{BE}$ is kept at 0 V or 0.87 V, it is possible to provide a voltage holding function with a self amplification function.

FIG. 7 illustrates a voltage holding circuit utilizing this voltage holding function.

This circuit uses an n channel MOS transistor Q1 whose drain or source is coupled to the base of an NPN bipolar transistor Q2. The MOS transistor Q1 has its gate coupled to a word line WL and supplied with a control clock $\phi$ A, and has the source or drain coupled to a bit line BL and supplied with an input clock $\phi$ B. In this circuit, a capacitive load is formed by the junction capacitor between the base and emitter and between the collector and base.

Figure 8:
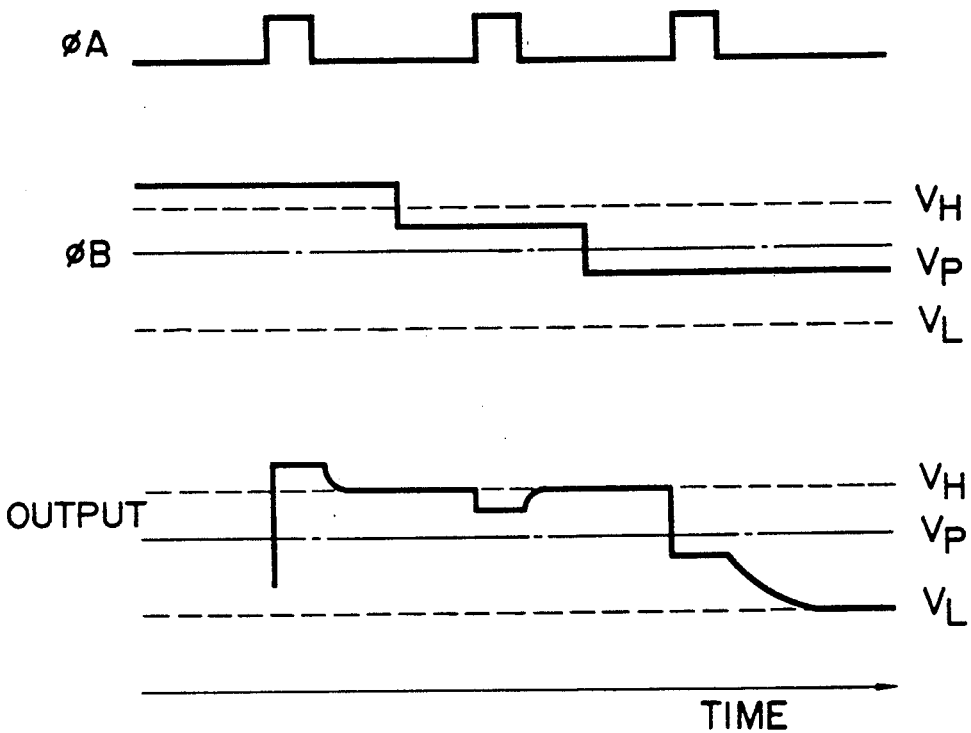
FIG. 8 is an operation timing chart for the memory cell shown in FIG. 7.

FIG. 8 illustrates the control clock $\phi^* A$ and input clock $\phi$ b of the MOS transistor Q1 in FIG. 7 and the voltage level at the output terminal provided at the node between the MOS transistor Q1 and the bipolar transistor Q2. In FIG. 8, $V_H$ is 0.87 V, Vp is 0.45 V and $V_L$ is 0 V.

Referring to FIG. 7, when the clock $\phi$ A becomes high, the MOS transistor Q1 is turned on. At this time, $\phi$ B > $V_H$ (0.87 V) is input to the base of the bipolar transistor Q2 and the capacitive load is charged above $V_H$. Thereafter, when the clock $\phi$ A becomes low level and the MOS transistor Q1 is turned off, the charged voltage of $V_H$ or above of the capacitive load, which is applied to the base, is discharged via the base-emitter path of the transistor Q2, i.e., a positive base current flows to the base, and the base voltage is kept at 0.87 V. When the clock $\phi$ B which is $0.45 V < \phi B < 0.87 V$, is applied to the base, a negative base current flows through the capacitive load via the collector-base path of the transistor Q2, and the output voltage or the base voltage rises to 0.87 V. When the clock $\phi$ B (<0.45 V) is applied through the MOS transistor Q1 to the base of the transistor Q2, a positive base current flows out through the base-emitter path and the base voltage becomes 0 V. In other words, when $\phi$ B > 0.45 V, the boundary potential, 0.87 V, is L kept, and when $\phi$ B < 0.45 V, 0 V is held Referring to FIG. 8, the connection node between the MOS transistor Q1 and bipolar transistor Q2 is treated as an output terminal; however, the input terminal of the clock $\phi$ B may serve as the output terminal if the MOS transistor Q1 is turned on again after the voltage is held.

FIG. 9 illustrates a circuit in which a capacitive element C such as a MOS capacitor, as separate from the bipolar transistor Q2, is coupled to the circuit of FIG. 7. The capacitive element C of this circuit can actively permit charging and discharging through the base. In this case, although the input terminal of the clock $\phi$ B also serves as the output terminal, the output terminal may be provided at the connection node of the bases of the transistors Q1 and Q2.

A memory is constituted by employing a bipolar transistor utilizing the above voltage holding function. In this case, the collector voltage to be applied to the bipolar transistor is varied between the time of holding a voltage, i.e., the time of data holding (a stationary state), and the time of charging and discharging, i.e., the time of data writing and reading (an active state). This voltage alteration will be described below.

In the circuit of FIG. 1, when $V_{CE}=6.25$ V as shown in FIG. 4, the low level of the base-emitter voltage $V_{BE}$ is 0 V and the high level thereof is 0.87 V. When the collector-emitter voltage $V_{CE}$ is 0.25 V and $V_{BE}$ is kept at the high level, a collector current $I_C$ of $1.5 \times 10^{-4}$ A always flows through the memory cell. When $V_{CE}=5.75$ V as shown in FIG. 5, however, the high level is maintained at 0.66 V, and the collector current $I_C$ becomes $5 \times 10^{-6}$ A. That is, when $V_{CE}=5.75$, the collector current $I_C$ is reduced to 1/30 of the one acquired when $V_{CE}=6.25$ V. In other words, the power dissipation of the memory cell can be reduced. When data is to be read out with $V_{CE}=5.75$ V, however, the high level in the memory cell drops to 0.50 V or below due to noise generated at the rising or falling of a word line or the charging of a capacitor on a bit line. It is therefore likely that the base-emitter voltage $V_{BE}$ drops to 0 V by the forward base current. That is, the allowed noise margin is only 0.66 V to 0.50 V=0.16 V. If data is read with $V_{CE}=6.25$ V, the noise margin increases to 0.87 V−0.45V=0.42 V, which makes it unlikely that the high level drops to the low level at the time of data reading. In reading cell data, therefore, setting the collector potential at the time of data reading (the active state) higher than that at the time of data holding (the stationary state) can prevent the memory from malfunctioning.

Figure 10:
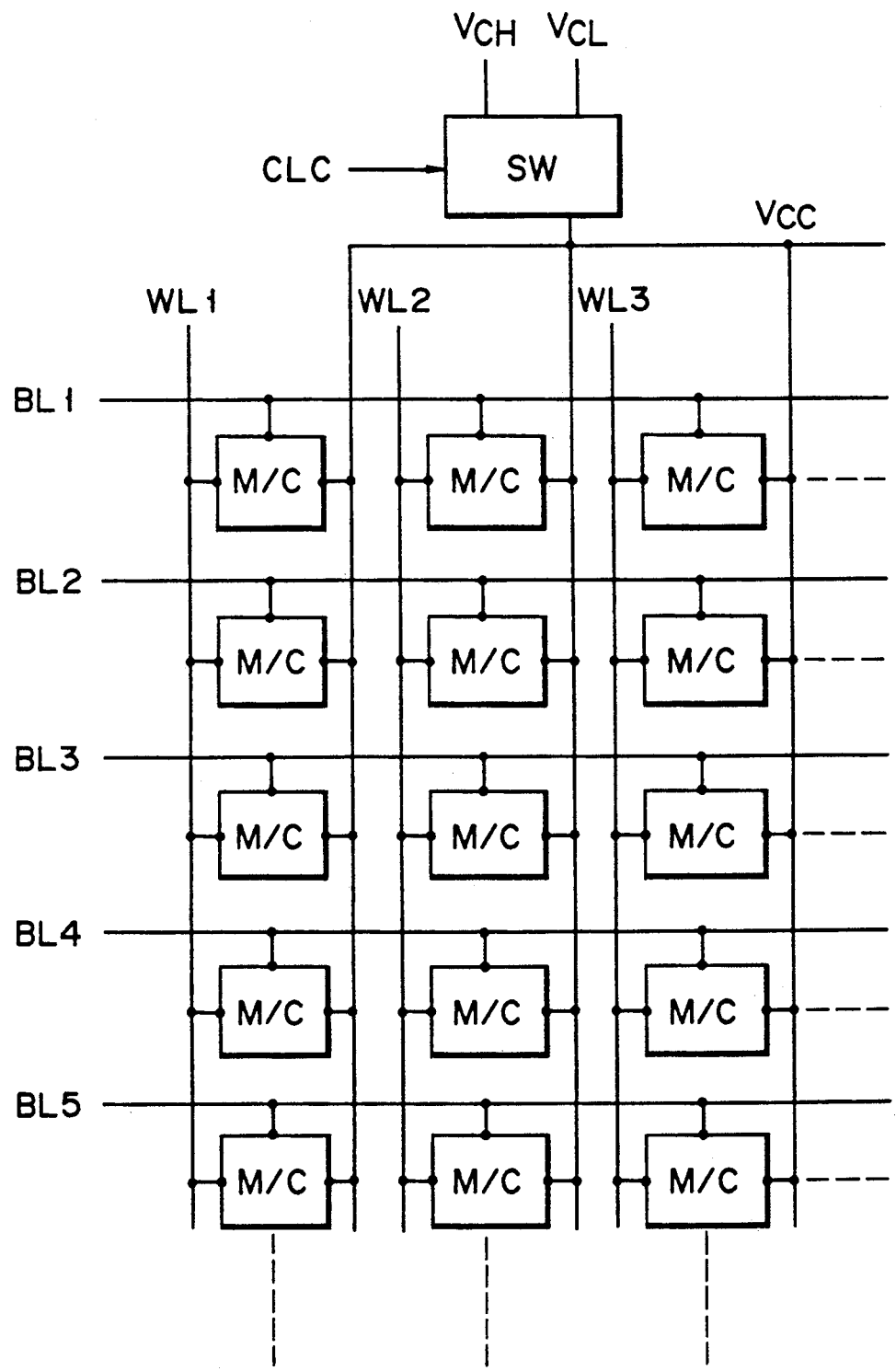
FIG. 10 is a circuit diagram of a semiconductor memory device according to one embodiment of this invention.

Paying attention to the above relation between the collector-emitter voltage $V_{CE}$ and collector current $I_C$, the value of $V_{CE}$ is changed between at the time of data holding and at the time of data reading. Referring now to FIG. 10, a memory device embodying this invention will be described.

Referring to this diagram, memory cells M/C arranged in a matrix form are constituted by a transistor circuit shown in, for example, FIG. 7 or FIG. 9. Word lines WL1, WL2, ... are provided along column arrays of memory cells M/C and are coupled to terminals WL of corresponding memory cells M/C. Bit lines BL1, BL2, ... are provided along row arrays of memory cells M/C and coupled to terminals BL of corresponding memory cells M/C. The memory cells M/C have their terminals $V_{CC}$ coupled to a switching element SW. This switching element SW selectively connects the collector line $V_{CC}$ to a high level ($V_{CH}$) or a low level ($V_{CL}$) in accordance with inputting of a clock CLC or no clock CLC.

When the clock CLC is input to the switching element SW earlier than an ON signal being input to the word lines WL1, WL2, WL3, ... in the memory device in FIG. 10, the collector of the bipolar transistor of a memory cell M/C, i.e., the collector line $V_{CC}$, is coupled to a high level ($V_{CH}$; 6.25 V, for example) power source. When the word lines are enabled, cell data is read onto the bit lines BL1, BL2, BL3, .... The clock signal is being input to the switching element SW until the word lines are disabled, and it is disabled when the word lines become disabled. At this time, the switching element SW switches the collector line $V_{CC}$ to a low level ($V_{CL}$; 5.75 V, for example).

According to another embodiment shown in FIG. 11, the terminals $V_{CC}$ of memory cells M/C corresponding to each word line WL1, WL2, WL3, ... are commonly coupled to a corresponding one of the collector lines $V_{CC1}$, $V_{CC2}$, $V_{CC3}$, .... The collector lines $V_{CC1}$, $V_{CC2}$, $V_{CC3}$, are coupled to VCH and VCL lines respectively through switching elements SW1, SW2, SW3, .... According to this embodiment, the clocks CLC1, CLC2, CLC3, ... to be input to the switching elements SW1, SW2, SW3, ... before enabling the word lines WL1, WL2, WL3, ... are independently generated so that such a clock is input only to the switching element which is coupled to those memory cells M/C for that word line which is enabled.

When a clock signal (e.g., CCL1) is input to a switching element (SW1), the collector line $V_{CC1}$ is coupled to $V_{CH}$ and is kept at a high level (6.25 V). When the word line (WL1) of the cell array corresponding to this switching element (SW1) thereafter, data is read onto the bit lines BL1, BL2, ... with the collector potential of the bipolar transistor being at a high level (6.25 V). After this word line becomes disabled, the clock (CLC1) is disabled. The clock disabling switches the line $V_{CC1}$ to the low level ($V_{CL}$; 5.75 V, for example) and the memory cells M/C comes to a data holding state (i.e., stationary state) at the low level.

Figure 12:
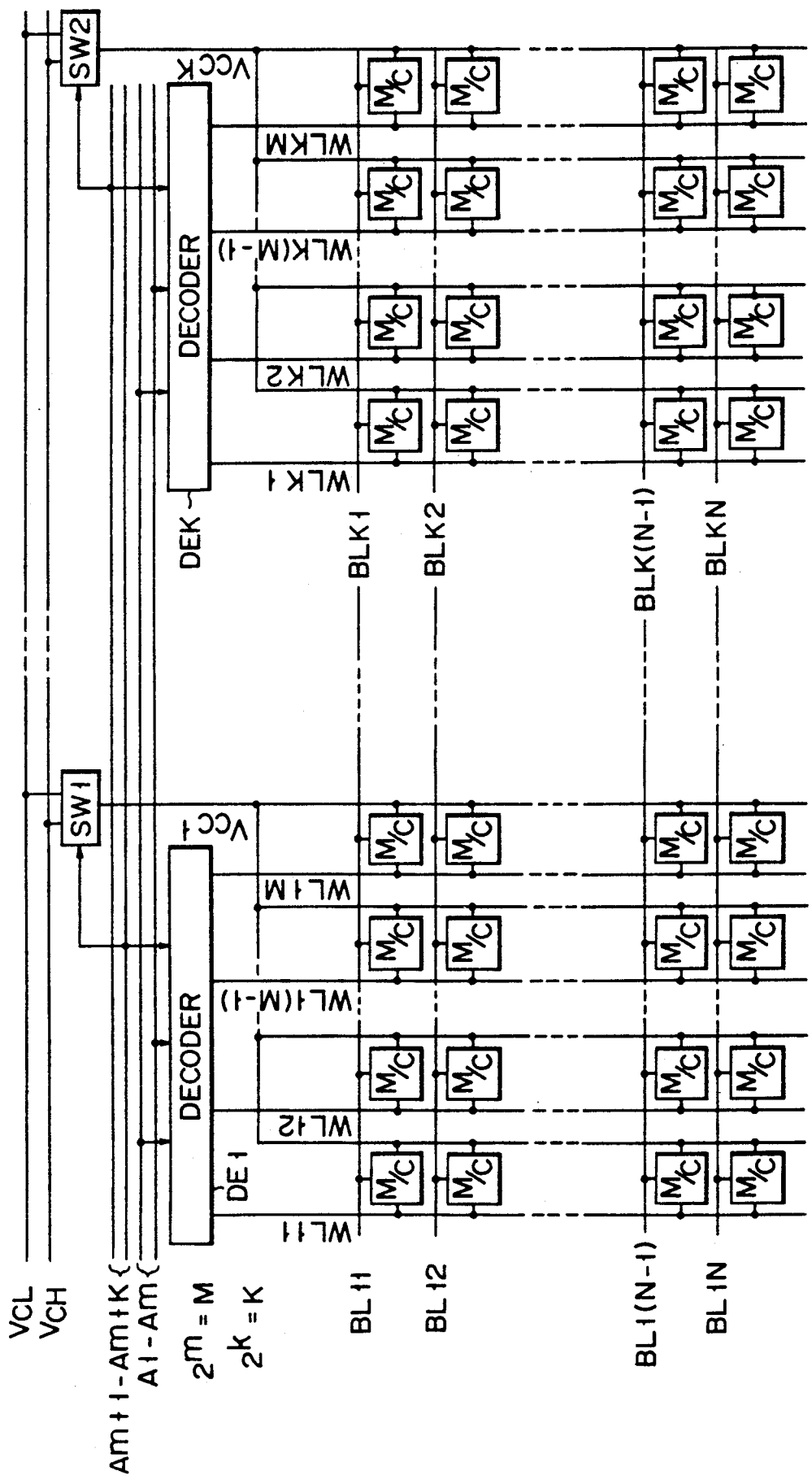
FIG. 12 is a circuit diagram of a memory device constituted by a plurality of cell array blocks.

A further embodiment will be described below referring to FIG. 12.

According to this embodiment, memory cells M/C are arranged in a plurality of cell arrays each of which is divided into a plurality of cell array groups. The memory cells M/C in each cell array group are coupled to respective word lines WL11 to WL1M, ..., or WLK1 to WLKM, bit lines BL11 to BL1, ..., or BLK1 to BLKN, and collector lines $V_{CC1}$ to $V_{CCK}$.

Word lines WL11 to WL1M, ..., and WLK1 to WLKM are respectively coupled to decoders DE1 to DEK. These decoders DE1 to DEK are commonly coupled to word line select address lines (A1 to Am) and are respectively coupled to $V_{CC}$ select address lines (Am+1 to Am+k). The address lines (Am+1 to Am+k) are coupled to respectively coupled to control terminals of switching elements SW1 to SWK corresponding to the cell array groups. These switching elements SW1-SWK are commonly coupled to power lines $V_{CL}$ and $V_{CH}$, and are respectively coupled to the collector lines $V_{CC1}$ to $V_{CCK}$.

Figure 13:
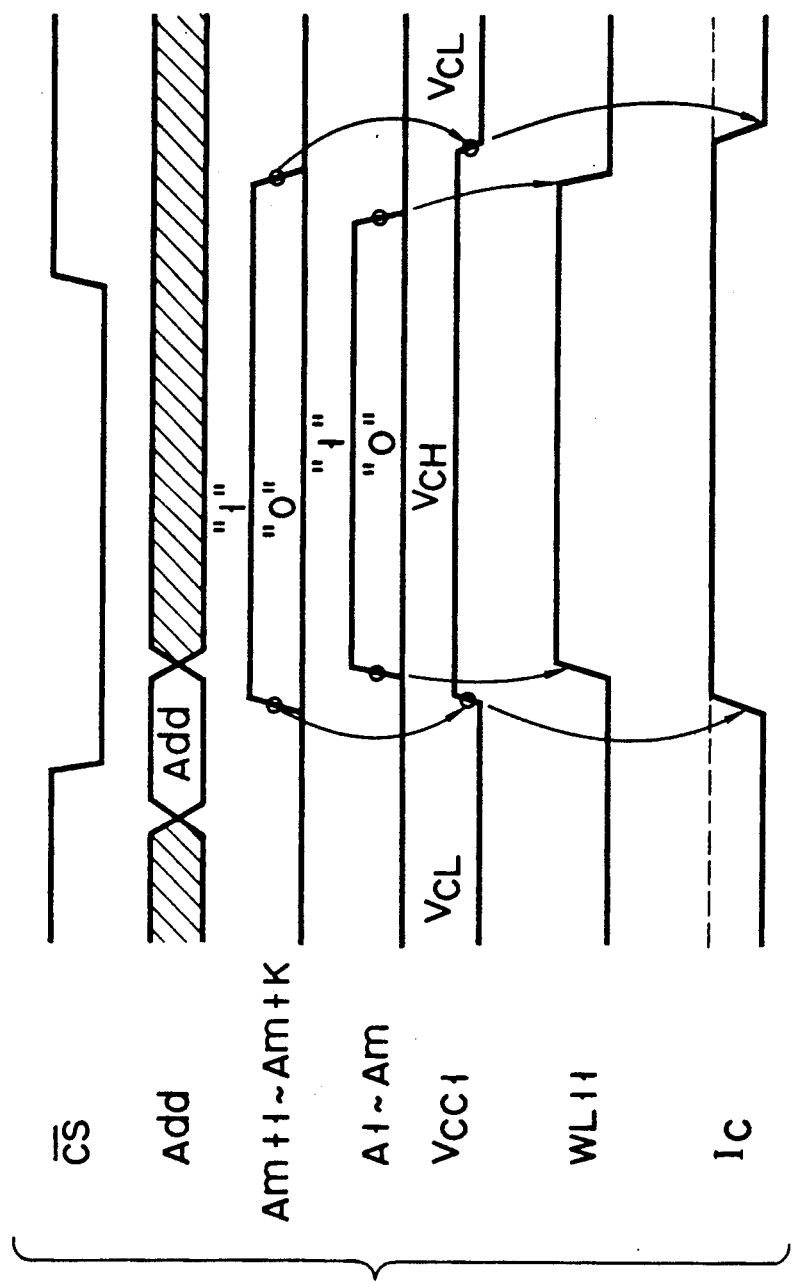
FIG. 13 is a timing chart for explaining the operation of the memory device shown in FIG. 12.

The operation of the memory device shown in FIG. 12 will be described with reference to the timing chart given in FIG. 13.

When a chip select signal $\overline{CS}$ becomes "L" from "H," the memory chip becomes active and an address is fetched in the chip. The fetched address is output onto the address lines (A1-Am and Am+1 to Am+k) in the chip via an address buffer and partial decoders. In this case, the $V_{CC}$ select address (Am+1 to Am+k) is output prior to the word line select address. As a result, the collector line $V_{CC1}$, for example, is switched to the high level $V_{CH}$ from the low level $V_{CL}$ by the switching element SW1 prior to the word line SW11. At the time a word line is selected, therefore, the collector-emitter voltage $V_{CE}$ of a selected memory cell rises to the high level $V_{CH}$ from the low level $V_{CL}$, thus increasing the collector current $I_C$. Since a read current or the base current $I_B$ increases, therefore, the bit line charging current at the time of data reading increases, thus ensuring high-speed data reading.

When data reading is completed and the word line WL1 becomes a high level (or unselected), the collector line $V_{CC1}$ is rendered to the low level $V_{CL}$ from the high level $V_{CH}$. This reduces the collector current $I_C$, which results in the base current $I_B$ (reading current). In other words, the power dissipation of the memory cell is reduced.

According to the above embodiment, it is also possible to select the collector lines $V_{CC1}$ to $V_{CCK}$ prior to the word lines WL11 to WLKM to change the former lines to the high level $V_{CH}$ from the low level $V_{CL}$, and to enable the $V_{CC}$ select address (Am+1 to Am+k) prior to the word line select address A1-Am and disable the former address prior to the latter address at the time the collector lines are changed to the low level $V_{CL}$ from the high level $V_{CH}$ after unselection of the word lines. Further, the word line select addresses A1-Am and Am+1 to Am+k may be enabled or disabled simultaneously. In this case, the timing for outputting both addresses may be controlled by the switching elements SW1-SWK and the word line decoders DE1-DEK. In addition, the high level $V_{CH}$ may be attained as an externally supplied voltage while the low level $V_{CL}$ may be attained by decreasing the high level $V_{CH}$ by an internal voltage dropping circuit. Alternately, the low level $V_{CL}$ may be attained as an externally supplied voltage while the high level $V_{CH}$ may be attained by increasing the low level $V_{CI}$ by an internal voltage increasing circuit.

Although, in the above embodiment, a voltage to be applied to the collector of the bipolar transistor is changed between in a data holding state and in a data reading state to achieve a desired purpose, the same may be achieved by changing the value of a resistance on the emitter side of the bipolar transistor. The following will describe a different embodiment which realizes the latter case.

FIG. 14 illustrates a circuit for measuring the characteristic of a bipolar transistor Q2, and FIG. 15 the relation between the base-emitter voltage $V_{BE}$, the base current $I_B$ and the collector current $I_C$ when the collector voltage is 7 V.

Referring to these diagrams, $I_B$ is a current flowing to the base from an external power source, and $-I_B$ is a reverse current. The base-emitter voltages $V_{BE}$ at the time the current changes to $I_B$ from $-I_B$ are 0 V and 1.08 V, thus ensuring a stable state. These stable voltages indicate "0" and "1" in the case where the bipolar transistor is used as a memory cell.

Figure 16:
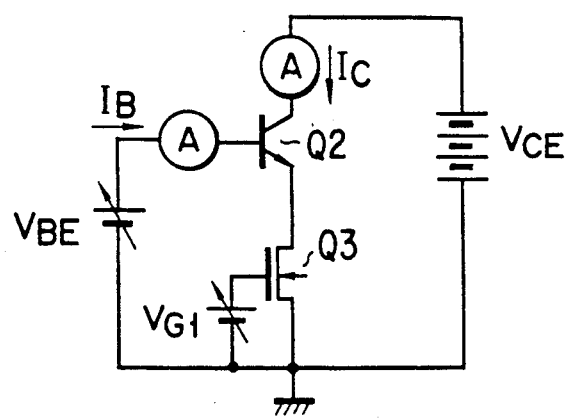
FIG. 16 is a circuit diagram of a circuit for measuring another characteristic of a bipolar transistor.
Figure 17:
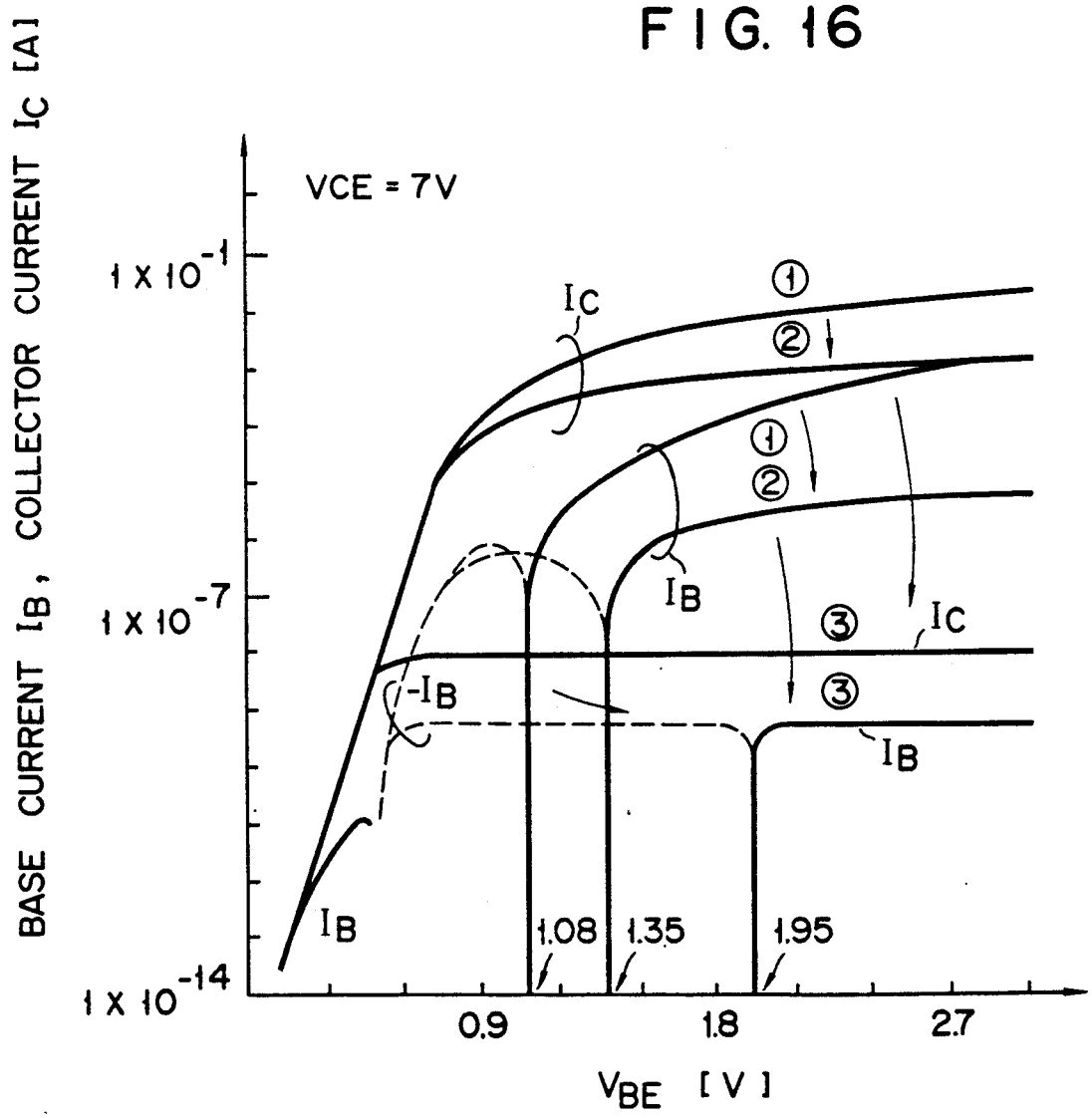
FIG. 17 is a diagram showing the characteristic provided by the circuit in FIG. 16.

FIG. 16 illustrates a circuit having an nMOS transistor Q3 as a resistor element in series to the emitter of the bipolar transistor Q2. FIG. 17 illustrates a characteristic obtained by measuring the transistor characteristic based on this circuit. As should be obvious from this characteristic, the collector current and base current in a region where the base-emitter voltage $V_{BE}$ is large are reduced in a case (2) where the nMOS transistor Q3 is coupled to the emitter of the bipolar transistor Q2 and 5 V is applied to the gate of the transistor Q3, as compared with a case (1) where the transistor Q3 is not coupled to the emitter of the transistor Q2. When the gate of the nMOS transistor Q3 is set to 0 V (case (3)), the channel resistance of this transistor Q3 increases, so that the base current and collector current are further reduced as compared with the case (2) where 5 V is applied to the gate of the transistor Q3. The state (3) indicates the collector current at the time the base of the bipolar transistor when used as a memory cell is holding a "1" level. In other words, changing the gate voltage of the nMOS transistor Q3 can reduce the collector current at the time of data holding, thus reducing the power dissipation of the memory.

Figure 18:
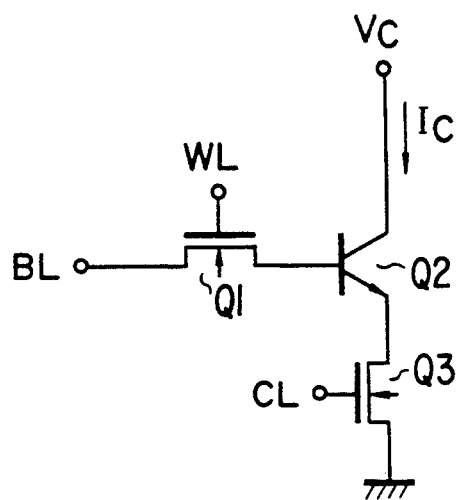
FIG. 18 is a circuit diagram of a memory cell for use in a semiconductor memory device according to a further embodiment of this invention.

FIG. 18 illustrates a memory cell M/C which has an nMOS transistor Q3 serving as a resistor element coupled in series to the emitter of a bipolar transistor Q2. The bipolar transistor Q2 has the base coupled through an nMOS transistor Q1 to a bit line (BL) terminal, with the gate of the transistor Q1 being coupled to a word line (WL) terminal.

The operation of the memory cell in FIG. 18 will be described according to the timing chart shown in FIG. 19.

At the time of data holding, a signal CL (=0 V) is input to the gate of the nMOS transistor Q3. At this time, a collector current $I_C$ corresponding to the state (3) flows through the bipolar transistor Q1 and data is held, as described above. At the time of data reading, a gate signal CL of 5 V is supplied to the gate of the nMOS transistor Q3 before the nMOS transistor Q1 having its drain coupled to the base of the bipolar transistor Q2 is turned on. As a consequence, a large collector current $I_C$ corresponding to the state (2) flows through the bipolar transistor Q2 and the base current $I_B$ increases accordingly. This improves the charging performance of the bit line BL. Turning the nMOS transistor Q1 on thereafter permits data to be read onto the bit line BL. When data reading is completed, the nMOS transistor Q1 is turned off and the level of the gate signal is then dropped to 0 V.

By setting the channel resistance of the nMOS transistor Q3 higher at the time of data holding than at the time of data reading, as described above, the through current $I_C$ flowing to the emitter from the collector is reduced to the current corresponding to the state (2) from the one corresponding to the state (1) and the power dissipation of the memory cell at the time of data holding can be reduced.

A still another embodiment involving resistance control will be described below referring to FIG. 20.

According to this embodiment, a plurality of memory cells M/C are arranged in a plurality of memory arrays, and those memory cells in each memory array are coupled to word lines WL1, WL2, WL3, ... and bit lines BL1, BL2, BL3, ....

Figure 21:
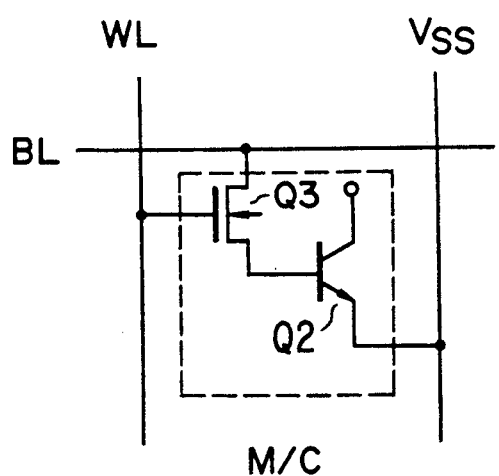
FIG. 21 is a circuit diagram of a memory cell used in the memory device shown in FIG. 20.

In each memory cell M/C, a bipolar transistor Q2 has its emitter coupled to a reference potential ($V_{SS}$) line, and an nMOS transistor Q3 has its source coupled to a bit line BL and its gate coupled to a word line WL, as shown in FIG. 21.

The $V_{SS}$ line (see FIG. 21) of the memory cell M/C shown in FIG. 20 is coupled to the drain of an MOS transistor Q4 whose source is coupled to a reference power source $V_{SS}$. At the time of data holding, a gate signal CLE of 0 V is input to the gate of the nMOS transistor Q4 and a small collector current as indicated by the state (3) flows through the bipolar transistor Q2, thus permitting data to be held with low power dissipation. When a gate signal CLE of 5 V is input to the gate of the nMOS transistor Q4 for reading data, the $V_{BE}$-$-I_B$ and $I_C$ characteristic as indicated by the state (2) is provided. Since the base current $I_B$ with respect to $V_{BE}$ in this state (2) is greater than the one in the state (3), data is read onto the bit line with the charging performance of the bit line being improved.

In the embodiment shown in FIG. 20, the emitters of the bipolar transistors included in a cell array may all be connected commonly, or the cell array may be divided into a plurality of blocks with the emitters of those bipolar transistors in each cell block being commonly connected. In the latter case, a gate signal is supplied to nMOS transistors coupled to the common emitter for each cell block array, and a gate signal of 5 V is input only to the gates of those nMOS transistors coupled to the common emitter of the bipolar transistors included in a block which has a memory cell to be accessed for data reading while a gate signal for the other nMOS transistors is kept at 0 V.

Figure 22:
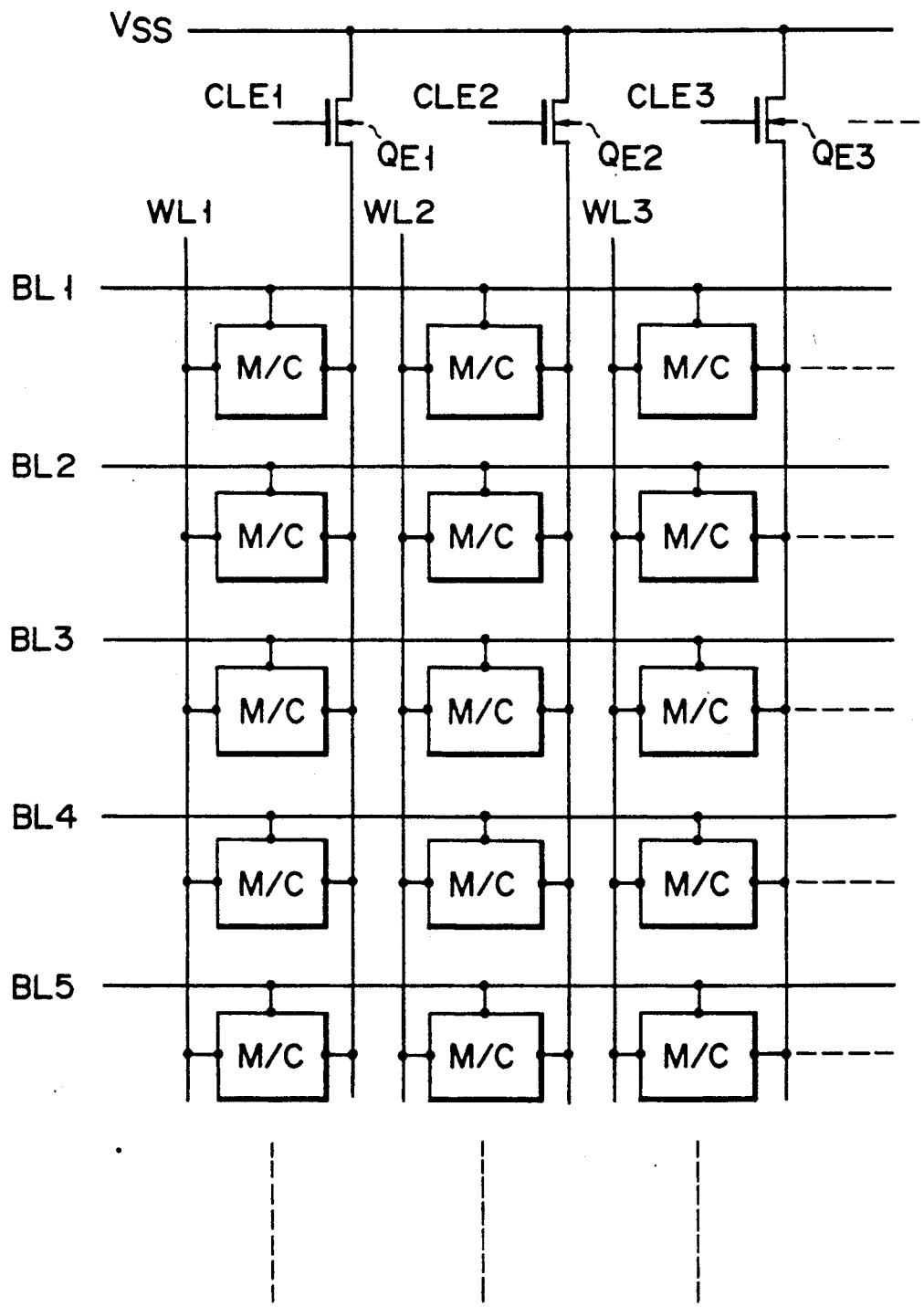
FIG. 22 is a circuit diagram of another memory device employing a variable resistor element.

A still different embodiment employing a variable emitter resistor will be described referring to FIG. 22.

According to this embodiment, the emitters of bipolar transistors are commonly connected for each cell array coupled to a coresponding word line WL1, WL2 ..., and the drains of nMOS transistors QE1, QE2, ... serving as a variable resistor element are coupled to the common emitter. The nMOS transistors have their sources coupled to a potential source ($V_{SS}$).

For each cell array, each of 5 V gate signals CLE1, CLE2, ... is input to the gate of that nMOS transistor QE1, QE2, ... which is coupled commonly to the cells included in that cell array, at least at the time of data reading.

Figure 23:
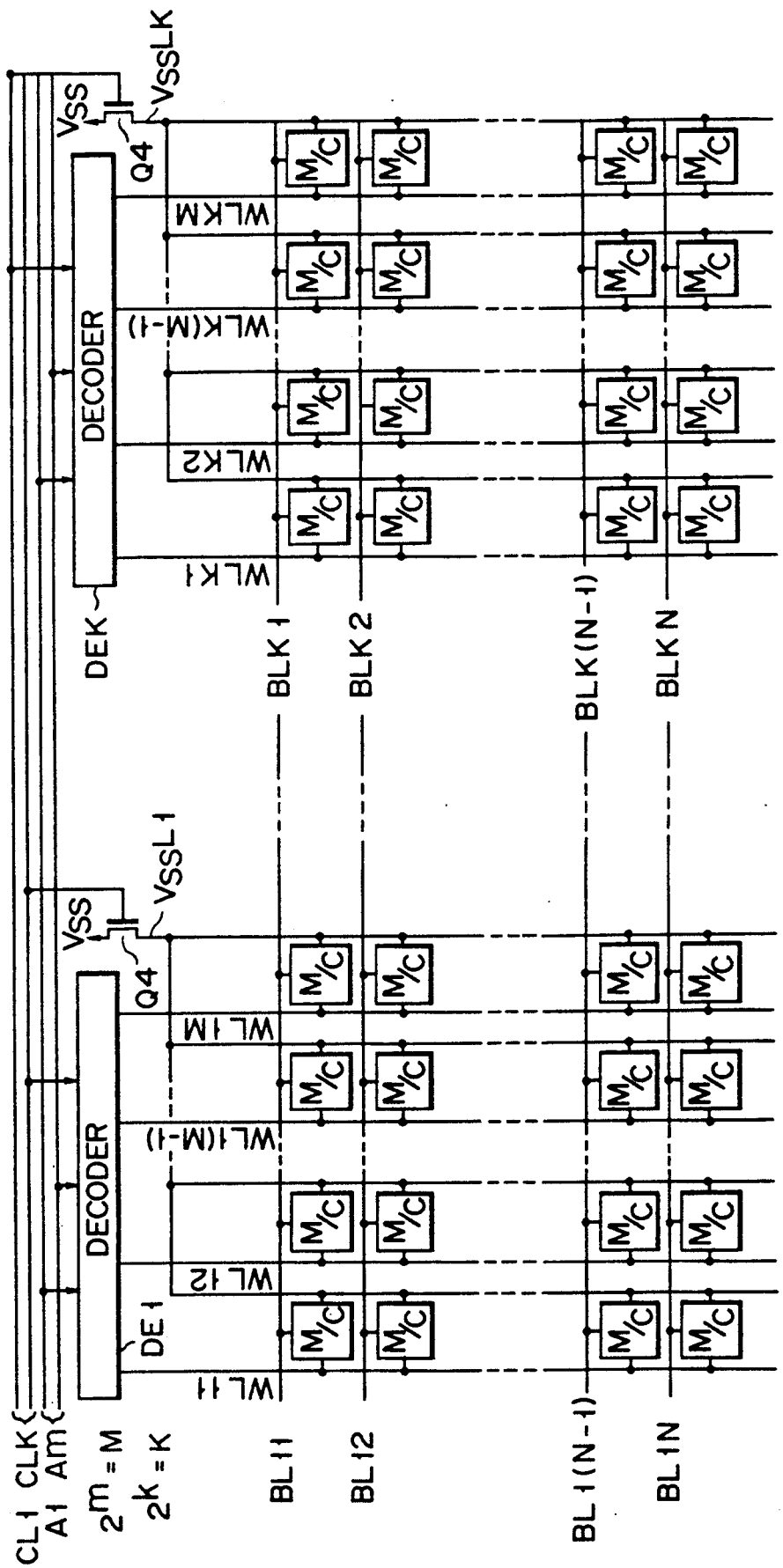
FIG. 23 is circuit diagram of a memory device constituted by a plurality of cell array blocks.

FIG. 23 illustrates a memory device constituted by a plurality of cell array blocks. According to this memory device, each cell array block comprises a predetermined number of cell arrays. Memory cells M/C of the cell arrays in each block are coupled to word lines WL11 (WLK1) to WL1M (WLKM) and bit lines BL11 (BLK1) to BL1N (BLKN). A reference potential line $V_{SS}L1$ ($V_{SS}LK$) coupled to the emitter of a bipolar transistor Q1 (see FIG. 21) of a memory cell M/C is coupled to a reference potential ($V_{SS}$) source through a nMOS transistor Q4 which serves as a variable resistor element. The gates of the transistors Q4 are controlled by clocks CL1 to CLK.

Figure 24:
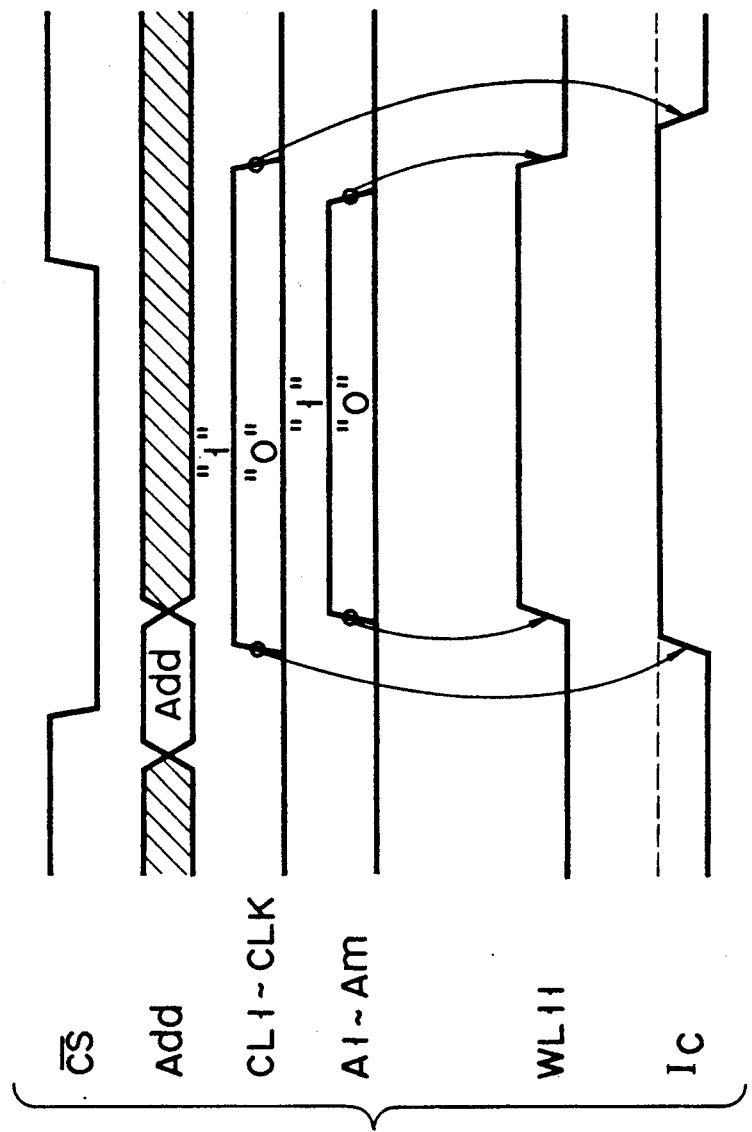
FIG. 24 is a timing chart for explaining the operation of the memory device shown in FIG. 23.

The operation of the memory device shown in FIG. 23 will be described referring to FIG. 24.

When a chip select signal $\overline{CS}$ becomes a low (L) level from a high (H) level, the memory chip becomes active and an address is fetched in this chip. When the address is fetched, address A1-Am and the clocks CL1-CLK are output onto the address line and clock lines in the chip through an address buffer and partial decoders. The clocks CL1-CLK are enabled prior to the word lines WL1-WLK and a 5 V gate signal is input to the nMOS transistor Q4. When the word line WL11, for example, is selected, the collector current flowing through the associated bipolar transistors increases and the base current increases at the same time. As a result, the charging performance of the bit lines BL11--BL1N is improved and data is read onto the associated bit line at a high speed.

When the word line select signal becomes an L level followed with a decrease in the level of the clock Cl1, the resistance of the nMOS transistor Q4 increases and the collector current $I_C$ decreases, thus permitting data to be held at low power dissipation.

In the above embodiment, a transistor having a low threshold value or a depletion mode transistor may be used for the nMOS transistors Q3 and Q4 serving as a variable resistor element. In this case, even with the clocks CL1-CLK being at an L level, the collector current $I_C$ would flow. This invention is also effective in a case where the H level of the clocks CL1-CLK is set lower than $V_{CC}$ and the L level is set higher than $V_{SS}$ to set the amplitude of the clocks lower than ($V_{CC} - V_{SS}$).

The nMOS transistor used in the embodiments described referring to FIGS. 18 to 24 may be replaced with a pMOS transistor, and the nMOS transistor which serves as a variable resistor element may be replaced with a variable resistor circuit.

Although the foregoing description has been given with reference to the time of data holding and the time of data reading, this invention can be utilized in a case involving data writing.

According to the semiconductor device embodying this invention, the collector current is changed while the reverse base current is maintained by altering the collector voltage or emitter resistance of a bipolar transistor serving as a memory cell between at the time of data holding and at the time of data reading or data writing. In this manner, therefore, a memory device capable of reading and writing data at a high speed and with low power dissipation can be provided.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a plurality of word lines;
   a plurality of bit lines;
   an array of memory cells each including a bipolar transistor and a switching element, each bipolar transistor having a base, a collector and an emitter in which a collector-emitter voltage is controlled by a voltage applied between the collector and the emitter so that a polarity of a base current is changed in accordance with an increase in a base-emitter voltage, and each switching element being provided between the base of a bipolar transistor and one of said bit lines and controllable through one of said word lines; and
   current changing means for changing a value of a current flowing through the collector of each of said bipolar transistor between a stationary state and an active state.

2. A semiconductor memory device according to claim 1, wherein said current changing means includes means for changing a potential of said collector of said bipolar transistor between said stationary state and said active state.

3. A semiconductor memory device according to claim 1, wherein said current changing means has a resistor element coupled to said emitter of said bipolar transistor and means for changing a resistance value of said resistor element between said stationary and said active state.

4. A semiconductor memory device according to claim 1, wherein said current changing means has a resistor element coupled to said emitter of said bipolar transistor and means for changing at least one of a potential of said collector of said bipolar transistor and a resistance value of said resistor element between said stationary state and said active state.

5. A semiconductor memory device according to claim 1, wherein said array of memory cells is divided into a plurality of cell block arrays in association with addresses, and said current changing means has a resistor element coupled to said emitter of said bipolar transistor and means for changing at least one of a potential of said collector and a resistance value of said resistor element for each of said cell block arrays between said stationary state and said active state.

6. A semiconductor memory device according to claim 1, wherein said array of memory cells is divided into a plurality of cell block arrays in association with addresses, and said current changing means has a resistor element coupled to said emitter of said bipolar transistor and means for changing at least one of a potential of said collector and a resistance value of said resistor element for each of said cell block arrays which is arranged along each word line, between said stationary state and said active state.

7. A semiconductor memory device according to claim 1, wherein said current changing means comprises means for selectively applying a voltage of a first level and a voltage of a second level higher than said first level to said collector of said bipolar transistor in accordance with said stationary state and said active state.

8. A semiconductor memory device according to claim 7, wherein said voltage applying means comprises switching means, coupled to said collector of said bipolar transistor, for switching between said first level voltage and said second level voltage.

9. A semiconductor memory device according to claim 1, wherein said current changing means comprises a plurality of voltage applying means, provided in association with said word lines, for selectively applying a voltage of a first level and a voltage of a second level higher than said first level to said collectors of said bipolar transistors of said array of memory cells associated with said word lines, in accordance with said stationary state and said active state.

10. A semiconductor memory device according to claim 1, wherein said array of memory cells is divided into a plurality of memory array groups, and said current changing means comprises means, coupled to each of said memory array groups, for selectively applying a voltage of a first level and a voltage of a second level higher than said first level to said collectors of said bipolar transistors in an associated memory array group in accordance with said stationary state and said active state.

11. A semiconductor memory device according to claim 1, wherein said current changing means comprises a plurality of variable resistor elements, provided for said word lines, respectively and each coupled to said emitters of said bipolar transistors in those of said array of memory cells which are associated with each of word lines, for changing a current to be supplied to said emitters in accordance with said stationary state and said active state.

12. A semiconductor memory device according to claim 11, wherein said variable resistor elements are each constituted by an nMOS transistor.

13. A semiconductor memory device according to claim 1, wherein said array of memory cells is divided into a plurality of memory array groups, and said current changing means comprises means, coupled to each of said memory array groups, for selectively applying a first current and a second current higher than said first current to said emitters of said bipolar transistors in an associated memory array group in accordance with said stationary state and said active state.

14. A semiconductor memory device comprising:
a memory array section including a plurality of memory cells arranged in rows and columns;
a plurality of word lines arranged in said column and to be supplied with a control clock; and
a plurality of bit lines arranged in said row and to be supplied with an input signal;
each of said memory cells including a bipolar transistor and a switching element, each bipolar transistor having a base, a collector and an emitter in which a collector-emitter voltage is controlled by a voltage applied between the collector and the emitter so that a polarity of a base current is changed in accordance with an increase in a base-emitter voltage, and each switching element being controllable by one of said word lines;
said memory arrange section having current changing means for changing a level of a current flowing through the collector of each of said bipolar transistors between an active state and a stationary state.

15. A semiconductor memory device according to claim 14, wherein said current changing means comprises means for applying a lower collector voltage to said collector of said bipolar transistor in said active state than in said stationary state.

16. A semiconductor memory device according to claim 14, wherein said current changing means comprises means for supplying a lower emitter current to said emitter of said bipolar transistor in said active state than in said stationary state.

17. A semiconductor memory device according to claim 16, wherein said emitter current supplying means has a variable resistor element coupled to said emitter and having a resistance value variable in accordance with said stationary state and said active state.

18. A semiconductor memory device according to claim 14, wherein said current changing means has a resistor element coupled to said emitter of said bipolar transistor and means for changing at least one of a collector potential of said bipolar transistor and a resistance value of said resistor element between said stationary state and said active state.

19. A semiconductor memory device according to claim 14, wherein said memory cell array section is divided into a plurality of cell array groups in association with addresses and said current changing means has means for changing at least one of an emitter current flowing through said emitter and a collector potential for each of said cell array groups.

20. A semiconductor memory device according to claim 14, wherein said memory cell array section is divided into a plurality of cell array groups in association with addresses, and said current changing means has a resistor element coupled to said emitter and means for changing at least one of a collector potential and a resistance value of said resistor element for each of said memory cell array groups arranged along each word line.

* * * * *